United States Patent
Bonora et al.

(10) Patent No.: US 7,841,820 B2
(45) Date of Patent: *Nov. 30, 2010

(54) UNIVERSAL MODULAR WAFER TRANSPORT SYSTEM

(75) Inventors: Anthony C. Bonora, Woodside, CA (US); Richard H. Gould, Fremont, CA (US); Roger G. Hine, Palo Alto, CA (US); Michael Krolak, Los Gatos, CA (US); Jerry A. Speasl, Pleasanton, CA (US)

(73) Assignee: Crossing Automation, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/938,236

(22) Filed: Nov. 9, 2007

(65) Prior Publication Data

US 2008/0101892 A1 May 1, 2008

Related U.S. Application Data

(63) Continuation of application No. 10/234,640, filed on Sep. 3, 2002, now Pat. No. 7,293,950.

(60) Provisional application No. 60/316,722, filed on Aug. 31, 2001.

(51) Int. Cl.
*B65G 54/02* (2006.01)
(52) U.S. Cl. .................. 414/217.1; 104/282; 198/619; 414/939
(58) Field of Classification Search ............ 198/619; 107/281–285; 414/749.2, 217.1, 939
See application file for complete search history.

(56) References Cited

U.S. PATENT DOCUMENTS

| | | | | |
|---|---|---|---|---|
| 4,649,830 A | * | 3/1987 | Tanaka | 104/138.1 |
| 4,805,761 A | * | 2/1989 | Totsch | 198/619 |
| 4,826,360 A | * | 5/1989 | Iwasawa et al. | 406/51 |
| 5,215,420 A | * | 6/1993 | Hughes et al. | 414/217 |
| 5,417,537 A | * | 5/1995 | Miller | 414/217 |
| 5,631,617 A | * | 5/1997 | Morishita | 335/216 |
| 6,039,316 A | | 3/2000 | Jackson et al. | 271/194 |
| 6,185,474 B1 | | 2/2001 | Nakamura et al. | 700/121 |
| 6,206,176 B1 | * | 3/2001 | Blonigan et al. | 198/619 |
| 6,430,839 B1 | * | 8/2002 | Kuroda | 34/210 |
| 6,526,330 B2 | * | 2/2003 | Soraoka et al. | 700/228 |
| 6,629,503 B2 | * | 10/2003 | Post | 104/281 |
| 7,269,475 B1 | | 9/2007 | Hogg et al. | 700/229 |
| 2002/0040657 A1 | * | 4/2002 | Davey | 104/282 |
| 2003/0190220 A1 | * | 10/2003 | White et al. | 414/217 |

* cited by examiner

*Primary Examiner*—Gregory W Adams
*Assistant Examiner*—Joshua I Rudawitz
(74) *Attorney, Agent, or Firm*—Martine Penilla & Gencarella, LLP

(57) ABSTRACT

The present invention is a wafer transfer system that transports individual wafers between chambers within an isolated environment. In one embodiment, a wafer is transported by a wafer shuttle that travel within a transport enclosure. The interior of the transport enclosure is isolated from the atmospheric conditions of the surrounding wafer fabrication facility. Thus, an individual wafer may be transported throughout the wafer fabrication facility without having to maintain a clean room environment for the entire facility. The wafer shuttle may be propelled by various technologies, such as, but not limited to, magnetic levitation or air bearings. The wafer shuttle may also transport more than one wafer simultaneously. The interior of the transport enclosure may also be under vacuum, gas-filled, or subject to filtered air.

17 Claims, 13 Drawing Sheets

UNIVERSAL MODULAR WAFER TRANSPORT SYSTEM

CLAIM OF PRIORITY

This application is a continuation of U.S. patent application Ser. No. 10/234,640 Filed Sep. 3, 2002, now U.S. Pat. No. 7,293,950, and entitled Universal Modular Transport System, which claims priority to U.S. Provisional Application No. 60/316,722, filed on Aug. 31, 2001. Each of these applications are incorporated by reference.

FIELD OF THE INVENTION

The present invention generally relates to an architectural approach to transporting wafers between processing tools. More particularly, the present invention is a wafer transport system that transports individual wafers, or packets of wafers, within an isolated or atmospheric environment.

BACKGROUND OF THE INVENTION

Considerable care must be taken in handling semiconductor wafers since a damaged wafer may result in considerable monetary loss. The semiconductor wafers must be retained in a clean room environment, substantially free of particulate contamination to preserve the purity of the payers deposited on the wafers. The requirements of a clean room environment places additional constraints on the handling of the semiconductor wafers.

For additional protection against contaminants, the semiconductor wafer are typically retained in sealed transport containers, such as SMIF pods, as they are moved throughout the manufacturing facility to minimize any exposure to the environment outside of the processing machines. The manufacturing facility is usually organizes into a plurality of bays, each including several processing machines. After the wafers in a pod have been treated at one or more of the machines, the pod leaves the bay and is transported to the next processing bay. Thus, there is essentially two types of transport loops in the manufacturing facility—the inter-bay loop in which the pods are moved between the bays, and the intra-bay loops in which the pods are moved between the processing machines of a single bay.

In the field of semiconductor processing, the manufacturing facility is typically organized into a plurality of bays 18, each including several processing machines 16. FIG. 1 shows an example of a bay 18 with several processing machines 16 including, but not limited to, equipment for depositing films on the wafers, for cleaning and/or conditioning the wafers at various stages, and the like. As is known in the art, the entrance of a processing machine 16 often includes a load port 22. Once a pod 12 is placed on the load port 22, the load port 22 automatically forwards the pod 12 towards the processing machine 16 so that the wafers may be removed from the transport pod or other container in a protective environment. This conventional transfer system may be used with processing stations 16 which do not include a load port 22.

Various transporting systems have been employed to transport the pods from bay to bay along the inter-bay loop of a manufacturing facility. Because of the amount of traffic in the inter-bay loop of the manufacturing facility, inter-bay transport is typically accomplished via overhead transport systems. The pods are delivered to a robotic storage house, often referred to as a "stocker," which receives the pods and automatically delivers the pods to the intra-bay loop. With some systems, the inter-bay transport system is coupled to the intra-bay transport system for direct transfer between the systems. However, direct transfer may be obtained only when a compatible, overhead transport system is used in the intra-bay loop.

Within the bays, the transport pods must be carried from machine to machine and delivered to a position where the wafers may be unloaded from the pod by the machine for processing. The machine entrance is often provided with a load port where the wafers may be automatically removed from the transport pod in a protected environment. Transferring the pods to the load port requires greater precision and control over the pod than moving the pods between inter-bay conveyor and the bays. Various methods are employed to move the transport pods between the different processing machines in a bay.

For example, many systems rely upon human workers to transfer the transport pods from port to port using a cart. The worker may manually lift the pod to the port. Alternatively, the worker may actuate a manual robotic link or other lifting device to move the pod to the port and, after processing has been completed, to return the transport pod to the cart. The worker then moves the cart to the next machine and repeats the process. Relying on human workers to transport the pods from machine to machine is time consuming and inefficient. Often, the worker will not be on hand to position a pod of fresh wafers in the load port and the machine will sit in a stand-by mode reducing the time during which the machine is operating and the overall efficiency of the processing factory. Moreover, care must be taken to ensure the lifting device is properly aligned with the load port as dropping the pod or exposing the pod to sharp jolts may damage the wafers. A means for automatically moving the transport pods between machines is desirable.

Another system of intra-bay transport relies on automatic guided vehicles (AGV's) which carry the pods between the machines and move the pods into the load port. Using AGV's reduces the need for a worker in the bay and may increase the speed at which the pods are moved through the bay. However, the size of the bay limits the number of AGV's which may operate in a single bay, leaving the machines in a stand-by mode waiting for the AGV to remove the pod of processed wafers and deposit a pod of fresh wafers in the transfer bay. An automated system which may be used to rapidly deliver pods to and remove pods from the processing machines without leaving the machines in a stand-by mode is desirable.

Overhead monorail systems are also used to transport pods along the intrabay loop. U.S. Pat. No. 6,308,818, entitled "TRANSPORT SYSTEM WITH INTEGRATED TRANSPORT CARRIER AND DIRECTORS," issued to Bonora et al, and assigned to Asyst Technologies, Inc. is an example of such a system, and is incorporated in its entirety herein. An embodiment of the overhead monorail system 50 is shown in FIG. 2. The overhead monorail system 50 includes a conveyor 14 and directors 56 for guiding the SMIF pods 12 between equipment front end modules ("EFEMS").

By way of example only, the conveyor 14 may also include one or more cross sections which may be used as a short-cut to other areas of the bay 18 to temporarily remove pods 12 from the main conveyor loop without interrupting the traffic flow on the main loop. The configuration of the conveyor 14 is subject to considerable variation depending on the constraints of a particular manufacturing facility.

FIG. 3 illustrates one embodiment of a conventional conveyor 14. The conveyor includes a pair of rails 32, 34 for supporting the transport pod 12 as the pod 12 moves along the conveyor path. The drive rail 32 propels and optionally guides the pod 12 along the rails 32, 34. Propulsion power for moving the pod 12 is supplied via the drive rail 32. Power may be supplied to the drive rail 12 via conventional means. Alternatively, power may be supplied to the drive rail 32 by a power bus. Rail 34 is an idler or support rail for supporting the transport pod 12 such that the pod 12 is held in a level orientation as it is moved along the conveyor path. Optionally, the support rail 34, as opposed to the drive rail 32, may be used to guide the transfer pod 12 as it travels along the conveyor system 14.

Hoists or similar devices may be used to lower the pods onto the load port of the processing machine. In order to successfully transfer the pod from the monorail to the machine, the pod must be precisely aligned with the load port and lowered onto the port in a controlled manner such that any swing of the pod is minimized. After processing, the pod is raised and transported to the next machine. Repeatedly raising and lowering the pod is challenging.

All of the transport systems mentioned above require the wafers to travel within an isolated container, or SMIF pod, to ensure that the wafers are not contaminated by harmful particles. Every time a batch of wafers are transported to a new process tool, the pod must form a seal with the front end of the processing tool prior to opening the pod. Similarly, when the batch of wafers have been processed and replaced back into the pod, the pod door must be replaced before the pod may be transported to the next process tool.

When wafers are transported within a pod, the batch of wafers must remain with the same pod throughout the entire manufacturing process. Every time a wafer must be inspected or arrives at the next processing tool, the SMIF pod must form a seal with the tool to isolate the wafers from contaminants and the pod door must be removed before a robot may remove a wafer from the SMIF pod. Similarly, the robot must place the wafer back into the SMIF pod, and the SMIF pod must be sealed and charged, before the SMIF pod can continue onto the next processing tool. This is a very time consuming task.

Many challenges arise from using a transfer system that transports SMIF pods. Often, a vendor requires a quick turnaround time for a small batch of wafers. These wafers may not need to pass through all of the processing stations within the wafer fabrication facility. Without the ability to pass SMIF pods ahead of the small batch, the processing of the small batch cannot be accelerated. Wafers that must be transported within SMIF pods cannot be randomly dispatched Ergonomic and safety issues coupled with the need for efficient and rapid material transport will be the major drivers in defining material handling systems for the 300 mm wafer generation and beyond. The automated material handling systems must have acceptable return on investment and must interface directly with all inline production equipment. With the increase in 300 mm equipment size, the utilization of floor space in the factory must improve. Solutions to provide higher wafer storage densities, short lead and install times, and better utilization of floor space through integration of process and metrology equipment must be developed.

It would be an advantage to integrate interbay and intrabay transport into one integrated system. Such a system would provide a direct, or tool-to-tool transport system. The throughput of wafers would be increased. The tool-to-tool transport system must be designed so that is can accommodate the extendibility, flexibility, and scalability demands on the factory.

Transporting individual wafers in a sealed environment, without the need for SMIF pods, would have several advantages. First of all, the throughout of the system could be greatly improved. Eliminating SMIF pods would allow a manufacturer to randomly dispatch wafers, accelerate the processing time of a wafer, and integrate metrology stations into the process sequence. Small lots of wafers could be easily processed and even be accelerated through the process sequence. The present invention provides these advantages.

SUMMARY OF THE INVENTION

One aspect of the present invention is to provide a wafer transport system that transports individual wafers within an isolated environment.

Another aspect of the present invention is to provide a wafer transport system that transports wafers by a shuttle. In one embodiment, a wafer shuttle is able to transport at least one wafer to a specific process station, whereby the wafer is loaded into the process station.

Yet another aspect of the present invention is to provide a wafer transport system that transports wafers within a wafer packet, further reducing the amount of the clean room that must be maintained under class-100 environment. In one embodiment, the wafer packet stores multiple wafers within an isolated environment, and the wafer packet is transported from tool to tool by a shuttle device.

Still another aspect of the present invention is to provide a wafer transport system that is slidably mounted, at least partially, by a frame or structure. In one embodiment, the wafer transport system may be vertically adjusted and secured to a frame which supports the wafer transport system.

Yet another aspect of the present invention is to provide a wafer transport system that provides wafer entry into a process station and wafer extraction from the process station in a clean manner.

Another aspect of the present invention is to provide a wafer transport system that includes a wafer shuttle for transporting a wafer into and out of a specific process station. In one embodiment, the wafer shuttle supports a wafer such that the shuttle may rotate when it reaches the opening of a process station and transfer the wafer into the processing station.

Yet another aspect of the present invention is to provide a wafer transport system that provides a "building-block" assembly that can be configured to the specific requirements of the surrounding process stations and/or wafer fab.

Another aspect of the present invention is to provide a wafer transport system that is capable of high-density wafer storage and/or buffering.

Another aspect of the present invention is to provide a wafer transport system that has a return path or loop, allowing empty shuttles to return to the beginning of the transport system at a high speed. In one embodiment, the transport system includes a separate return path or loop whereby an empty shuttle may travel along after the wafer has been deposited within the process station.

Still another aspect of the present invention is to provide a wafer transfer system that can transport multiple shuttles simultaneously within an isolated environment. In one embodiment, the wafer transfer system has multiple index stations whereby a shuttle may transfer to another track.

Yet another aspect of the present invention is to provide a wafer transport system that includes a passively stable wafer shuttle. In one embodiment, the wafer shuttle is driven by a magnetic levitation system that has no moving parts. If the system loses power, the shuttle will be supported by the permanent magnets located at the base of the shuttle.

Another aspect of the present invention is to provide a control system for precisely locating the wafer shuttle at wafer transfer positions. In one embodiment, as the wafer shuttle nears the wafer transfer position, a servo control overrides the magnetic levitation system and controls the movement of the wafer shuttle. In another embodiment, an optical recognition system assist the magnetic levitation system to precisely position the wafer shuttle.

A further aspect of the present invention is to provide a wafer transfer system whereby the wafer shuttle is driven by a vehicle located external to the wafer transport enclosure. In one embodiment, a magnetic vehicle is located externally to the wafer transport enclosure. The magnetic vehicle travels along the bottom of the wafer transport enclosure and drives the wafer shuttle that is located within the wafer transport enclosure.

BRIEF DESCRIPTION OF THE DRAWINGS

FIG. 6A is a front view of an embodiment of the present invention, illustrating a wafer transfer mechanism that vertically transfer a wafer into a processing tool; FIG. 6B is a front view of an embodiment of the present invention, illustrating a wafer transfer mechanism located within the wafer transport enclosure; FIG. 6C is a front view of an embodiment of the present invention, illustrating a wafer transfer mechanism located within a processing tool; FIG. 6D is a front view of an embodiment of the present invention, illustrating a wafer transfer mechanism located within a transition chamber; FIG. 6E is a front view of an embodiment of the present invention, illustrating a wafer transfer mechanism located within the wafer transport enclosure and grips the wafer from the top;

FIG. 8A is a plan view of an embodiment of a magnetic levitation wafer handler; FIG. 8B is a plan view illustrating the wafer handler in FIG. 8A in operation;

FIG. 11A is a plan view of an embodiment of a dual level side-supported magnetic levitation transport system; FIG. 11B is a front cross-sectional view of the dual level side-supported magnetic levitation transport system shown in FIG. 11A; FIG. 11C is an area view of section C shown in FIG. 11B; FIG. 12A is a plan view of another embodiment of the present invention; FIG. 12B is a plan view of an embodiment of a wafer handler, illustrating the range of motion of the wafer handler.

DETAILED DESCRIPTION OF THE INVENTION

The wafer transfer system 100 is an architectural approach to constructing a tool-to-tool wafer transport system. As described in more detail below, a preferred embodiment of the wafer transfer system 100 transports individual wafers within an isolated environment. Other embodiments of the wafer transfer system 100 may transport multiple wafers, a packet of wafers, or a wafer cassette between processing stations.

Figure 1:
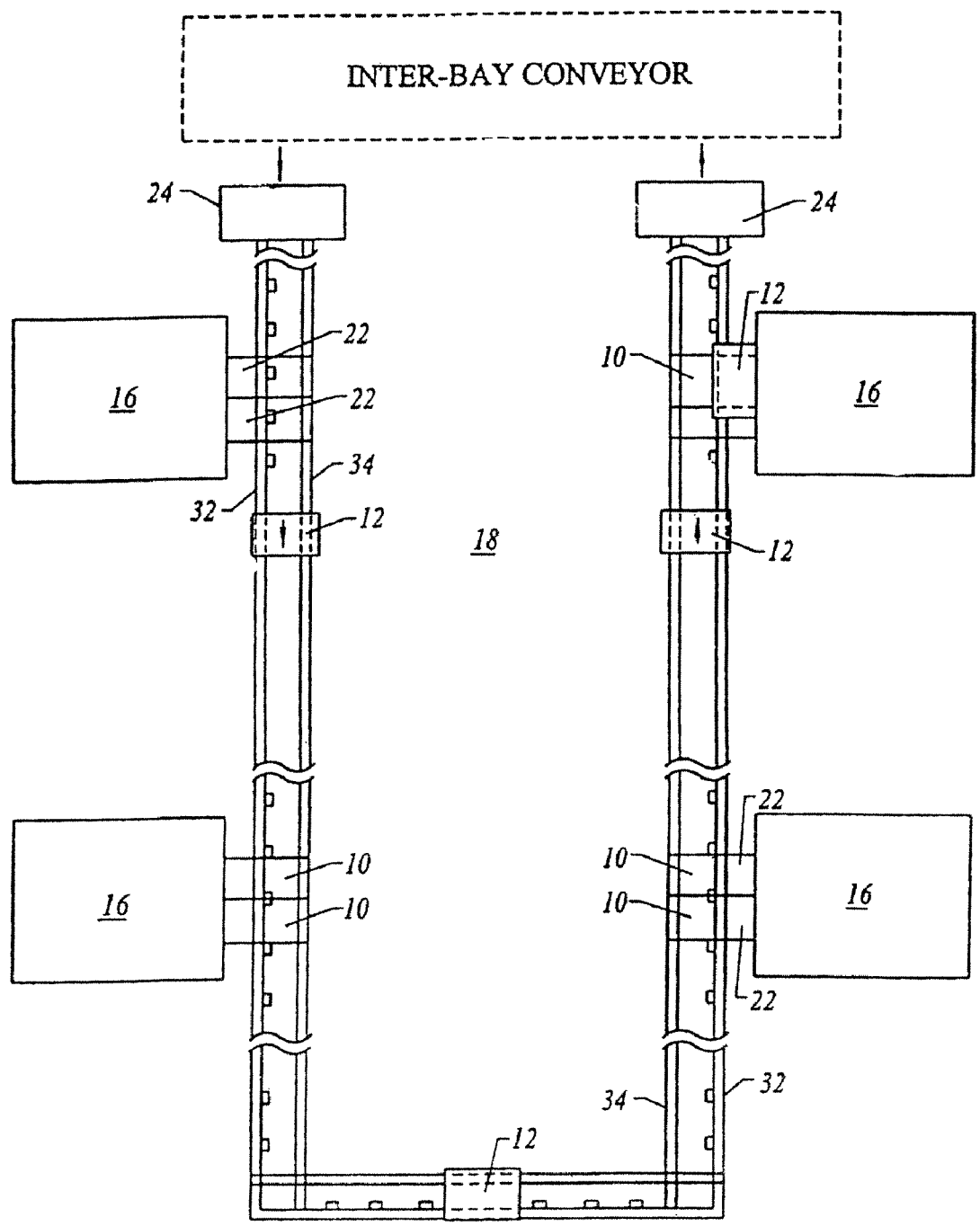
FIG. 1 is plan view of a conventional conveyor system for transporting wafers throughout a wafer fabrication facility.
Figure 2:
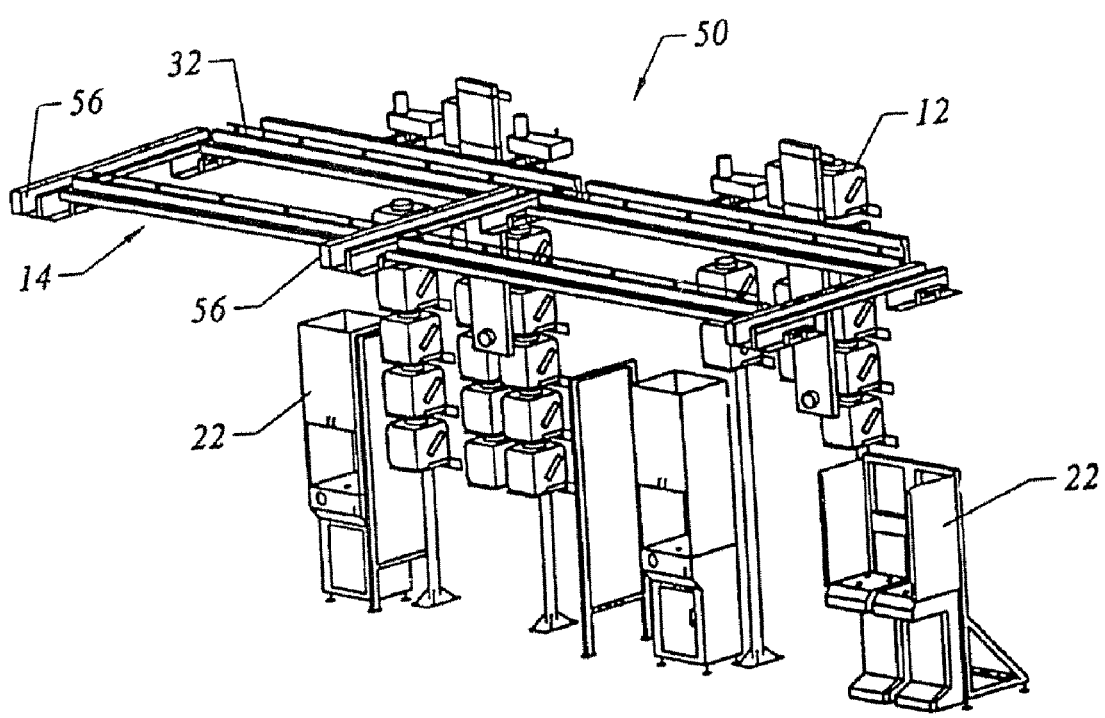
FIG. 2 is a perspective view of an embodiment of a conventional automated material handling system.
Figure 3:
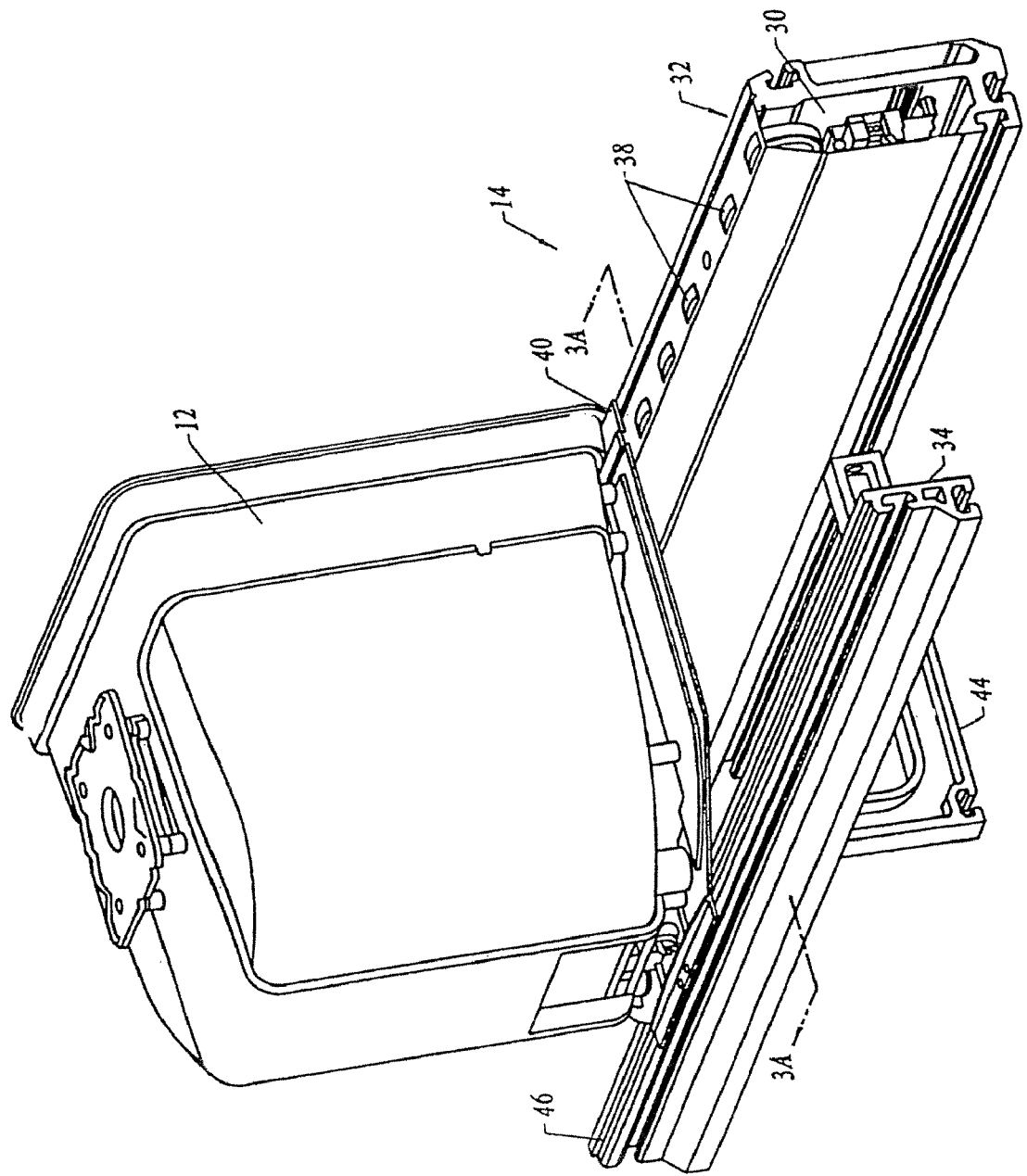
FIG. 3 is a perspective view of a conventional conveyor system for transporting SMIF pods according to the automated material handling system shown in FIG. 2.
Figure 4:
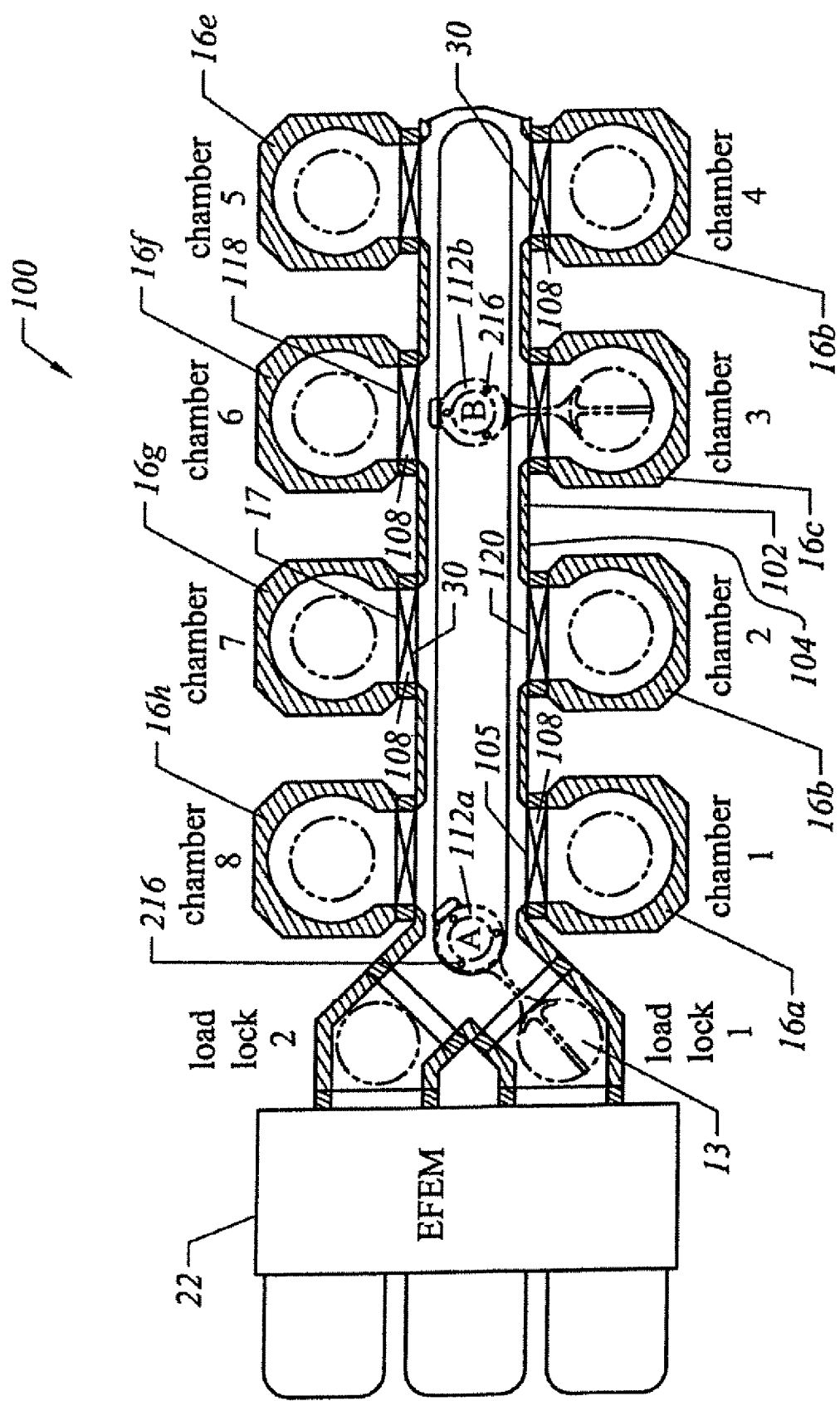
FIG. 4 is a plan view of an embodiment of the present invention.

FIG. 4 illustrates a first embodiment of the wafer transfer system 100. In general, the wafer transport system 100 is designed to transport a wafer 13 initially from an EFEM 22, and then between chambers 16—not returning the wafer 13 to the EFEM 22 until the process sequence is complete. The wafer transport enclosure 102 provides an isolated, clean environment to execute all of these tasks. As shown in FIG. 4, a first embodiment of the wafer transport enclosure 102 includes at least one wafer transport tube 104, and a transition chamber 108 that secures to each chamber 16. If the wafer transport enclosure 102 consists of a single wafer transport tube 104, the wafer transport tube 104 will include an opening 105 aligned with each chamber opening 17.

In a preferred embodiment, the wafer transfer system is modular, creating a "building-block" concept or architectural approach to constructing an isolated environment by which wafers may travel through. In a preferred embodiment, the wafer transport enclosure 102 is modular. Accordingly, the wafer transport tube 104 and the transition chamber 108 are universal building blocks.

To create a "building block" architecture, the mounting surfaces located at each end of the wafer transport tube 104 and the transition chamber 108 are preferably standard, universal mounting surfaces. This way, each component of the wafer transport enclosure 102 (e.g., wafer transport tube 104 and transition chamber 108) may secure to each other and form an airtight seal. As will become apparent as further embodiments are disclosed, there are many configurations possible for the wafer transport enclosure 102.

The chambers 16 may comprise any type of processing station required in a wafer fabrication facility. By way of example only, a chamber 16 may comprise an inspection tool, a processing tool, a metrology tool, an alignment tool, or a stocker. It is within the spirit and scope of the invention for the chamber 16 to comprise other processing stations. A chamber 16 may also function as a wafer transfer chamber for transferring wafers between different wafer transport tubes 102 (e.g., a wafer may be transferred between two separate wafer transfer systems 100). The wafer transfer system 100 may include fewer or more chambers than are shown in FIG. 4.

A transition chamber 108 is mounted between each chamber 16 and the wafer transport enclosure 102. Securing the wafer transport enclosure 102, the transition chamber 108, and the chambers 16 together form an airtight system by which wafers may be transferred between the EFEM 22 and each chamber 16. The transition chamber 108 preferably contains at least one isolation valve 30. When closed, the isolation valve 30 functions to maintain an isolated, clean environment within both the wafer transport enclosure 102 and the chamber 16.

The transition chamber 108 functions as a pass-through enclosure that connects the chamber 16 to the wafer transport enclosure 102. One function of the transfer chamber 108 is to isolate the interior of the chamber 16 from the interior of the wafer transport enclosure 102. As shown in FIG. 4, the transition chamber 108 has a chamber mounting surface 118 and a wafer transport enclosure mounting surface 120. The mounting surfaces 118 and 120 are designed to form an airtight seal with the surface it mounts to.

The isolation valve 30 is preferably biased in a closed position. When a wafer is transferred between a chamber 16 and a shuttle 112, the isolation valve 30 must be open to allow a wafer to pass through. Maintaining two separate environments has several advantages. For example, if the two environments (e.g., interior of a chamber 16 and the interior of a wafer transport enclosure 102) were shared, the entire system would have to shut down while one of the chamber 16 is being maintained or repaired. Similarly, the interior of a chamber 16 may remain isolated while a section of the wafer transport enclosure 102 is replaced or repaired. Maintaining two separate environments minimizes or prevents a particle within the chamber 16 from entering the wafer transport enclosure 102, and minimizes or prevents a particle within the wafer transport enclosure 102 from entering the chamber 16.

In one embodiment, the transition chamber 108 may include a wafer transfer mechanism (described later) for transferring a wafer between a chamber 16 and a wafer shuttle 112. In this embodiment, the transition chamber 108 preferably includes two isolation valves (see FIG. 6D).

The wafer transfer system 100 may operate with multiple wafer shuttles 112. As shown in FIG. 4, the wafer transfer system 100 includes at least two wafer shuttles—shuttle 112a and shuttle 112b. As will be described in more detail later, and by way of example only, the wafer shuttles 112 primarily transport wafers between chambers 16, or between a chamber 16 and an EFEM 22. If there are multiple wafer shuttles simultaneously traveling within a wafer transport enclosure 102, the wafer transport enclosure 102 will include multiple tracks so that the shuttles may pass each other, and travel in different directions. The track system is described later in more detail.

In a preferred embodiment, all of the modular components are secured together and form an airtight seal. An airtight wafer transport enclosure 102 will provide an environment that is isolated from the surrounding atmospheric conditions of the wafer fabrication facility. As previously mentioned, a clean environment must be maintained to minimize the particles that may come into contact with a wafer 12. Maintaining a clean environment for the entire wafer fabrication facility is very expensive and unnecessary. Similar to a SMIF pod, the volume of the interior of the wafer transport enclosure 102 is a fraction of the size of the entire wafer fabrication facility. A smaller volume of space is easier to maintain a clean environment.

Different types of environments within an airtight wafer transport enclosure 102 may created and maintained. For example, environments such as, but not limited to, vacuum, nitrogen, filtered air, and other gasses may exist. The wafer transport enclosure 102 must have some way to maintain and regulate the environment within the wafer transport enclosure 102. In one embodiment, each wafer transport tube 104 includes an input/output line 116 (see FIG. 5). If the wafer transport enclosure 102 is under vacuum, the input/output line 116 provides a closed system for maintaining the vacuum. If the wafer transport enclosure 102 is filled with a gas, such as nitrogen, the input/output line 116 provides a closed system for maintaining the gas pressure. These closed systems require a remote monitoring system to monitor and regulate the environment. Systems for monitoring a vacuum or gas environment are well known within the art and do not require further disclosure. The sensors may be mounted anywhere within the wafer transport enclosure 102 as long as the sensor does interfere with the travel of the wafer transport mechanism 112.

Figure 5:
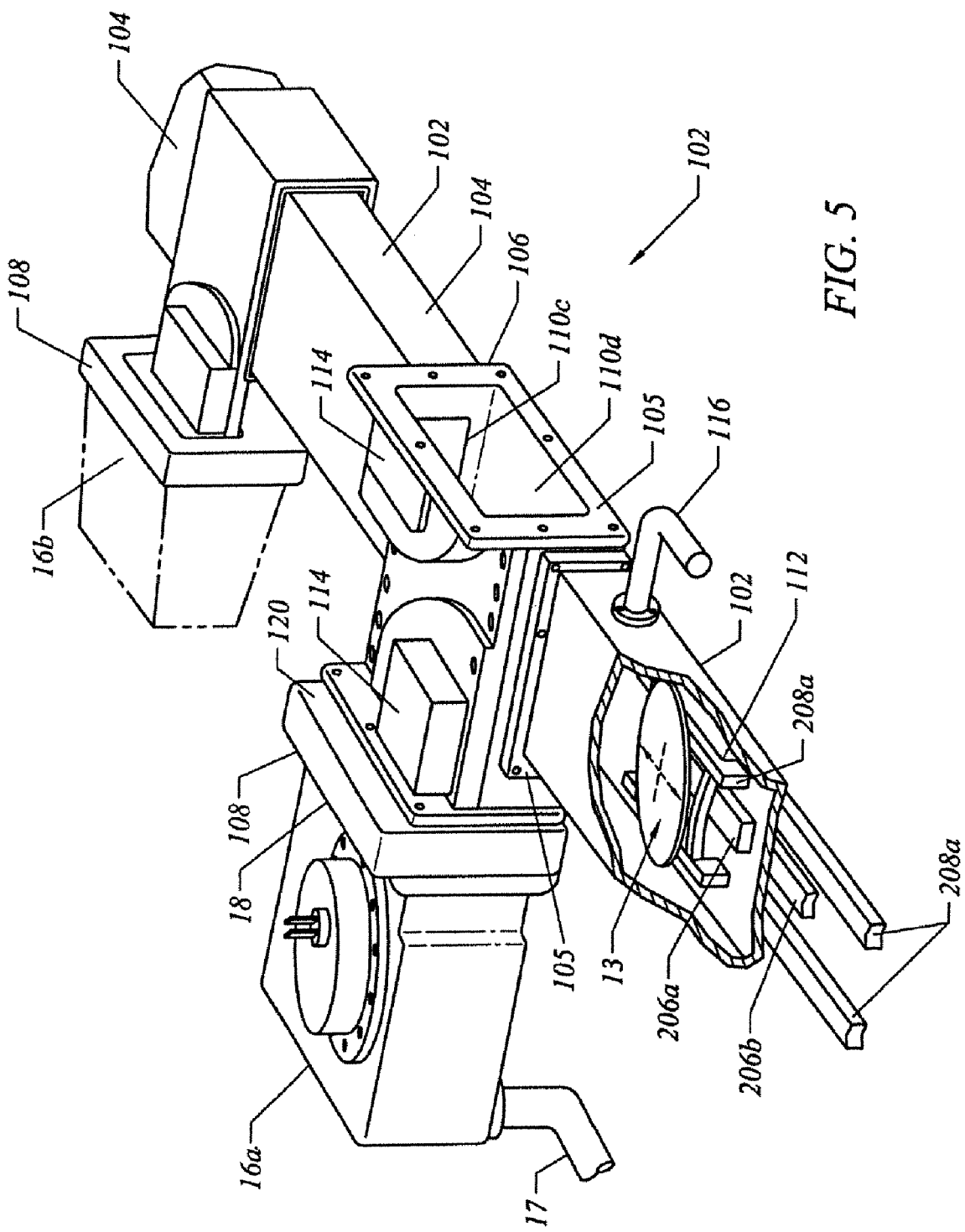
FIG. 5 is a perspective view of a first embodiment of the wafer transport enclosure of the present invention.

A second embodiment of the linear transfer system 100 is illustrated in FIG. 5. In this embodiment, the components of the wafer transport enclosure 102 include a wafer transport tube 104, a wafer transfer chamber 106, and a transition chamber 108. FIG. 5 illustrates that each component of the wafer transport enclosure 102 has a rectangular cross section. It is within the spirit and scope of the invention for each component to have other cross-sectional configurations such as, but not limited to, circular, square, or oval. Each wafer transport tube 104 is also shown as a linear section or structure. The wafer transport tube 104 may be non-linear. By way of example only, the wafer tube 104 may also comprise a curved channel or structure.

Regardless of the exterior shape or material, each wafer transport tube 104 is preferably a hollow enclosure with two open ends. Preferably, both ends of the wafer transport tube 104 have the same mounting surface 105. In one embodiment, the mounting surface 105 is a flange that secures to a side of the wafer transfer chamber 106. The mounting surface 105 may also consist of other structures and mount to the wafer transfer chamber 106 by other methods (e.g., welded).

The wafer transfer chamber 106 preferably has multiple openings 110. Each opening 110 must be large enough to allow a shuttle 112, while supporting a wafer 13, to pass through the opening 10 unobstructed. Depending on the configuration of the wafer transport enclosure 102, all the openings 110 do not have to be used. The wafer transfer chamber 106 is therefore modular, allowing a manufacturer to customize the design of the wafer transport enclosure 102. By way of example only, and as shown in FIG. 5, openings 110a (not shown), 110b (not shown), and 110c are used to transfer a wafer 13 between the chambers 16a and 16b. Opening 110d is not closed off only to illustrate opening 110c. Normally, in this configuration, the opening 110d would have a plate secured to the flange 105 and create an airtight seal to prevent air from entering into the interior of the wafer transport enclosure 102. Providing the wafer transfer chamber 106 with multiple openings 110 turns the wafer transfer chamber 110 into a "hub," whereby multiple paths can stem from a single structure. FIG. 5 illustrates that the wafer transfer chamber includes four opening. It is within the spirit and scope of the present invention for each wafer transfer chamber 106 to include more or fewer openings.

The wafer transfer chamber 106 may includes a wafer transfer mechanism that is capable of transferring a wafer between the shuttle 112 and the chamber 16. Each wafer transfer chamber 106 is configured with two wafer transfer mechanism mounting surfaces 114. The assembled wafer transport enclosure 102 shown in FIG. 5 illustrates that the mounting surfaces 114 are located on the top surface of the wafer transfer chamber 106. In this embodiment, the wafer transfer mechanism would grab the wafer 13 from the top. The wafer transfer mechanism may include any type of robot known within the art and does not require further disclosure. The wafer transfer chamber 106 may also include mounting surfaces 114 located on the bottom surface. In such a configuration, a robot will grab the wafer 13 from the bottom surface.

In a preferred embodiment, a single wafer is transported throughout the wafer transport enclosure 102 by a wafer shuttle 112. The shuttle 112 may support the wafer 13 in several different ways. For example, the wafer shuttle may include multiple wafer supports 121 that support the wafer 12 by an edge exclusion area located on the bottom surface of the wafer 13. Alternatively, the shuttle 112 may support the wafer by a vacuum grip. Other ways to support a wafer 12 are known within the art and may be incorporated into the shuttle 112.

FIG. 5 illustrates that the shuttle 112 supports and transports a single wafer 13. The shuttle 112 may also simultaneously transport multiple wafers, transport a wafer packet (described later), or transport a wafer cassette. The shuttle 112 may support the wafer(s) 13 in a vertical or horizontal orientation.

FIGS. 6A-6E illustrate several configurations of the wafer transfer system 100. FIGS. 6A-6E are not intended to serve as an exhaustive list of possible configurations.

Figure 6A:
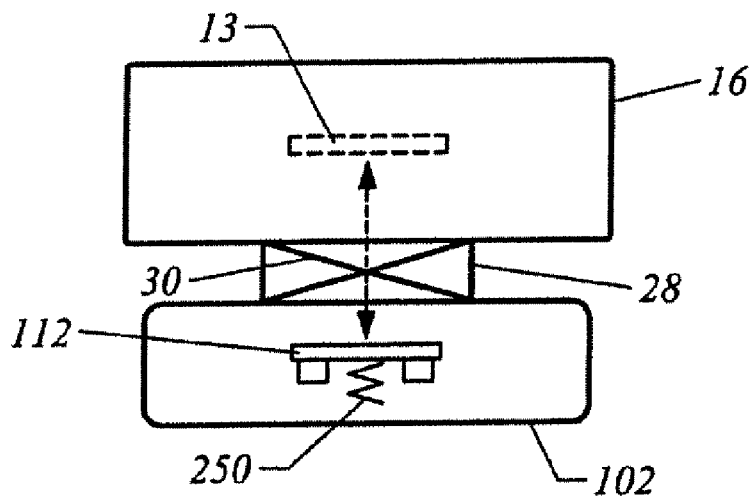
FIGS. 6A-6E.

FIG. 6A illustrates a vertical lift transfer system for transferring a wafer between the shuttle 112 and a chamber 16. In this embodiment, the chamber 16 is located above the wafer transport enclosure 102, separated by a transition chamber 28. When the shuttle 112 comes to rest proximate to the chamber 16, the wafer 13 is positioned over a vertical lift mechanism 250. After an isolation valve 30 opens, the vertical lift mechanism 250 engages the wafer 13 and places the wafer 13 into the chamber 16. The isolation valve 30 is preferably closed while the wafer 13 is being processed in order to maintain separate environments between the chamber 16 and the wafer transport enclosure 102. When wafer processing is complete, the isolation valve 30 will open, allowing the vertical lift mechanism 250 to retrieve the wafer 13 from the chamber 16 and place the wafer 13 back onto the shuttle 112. The wafer 13 may then be transported to another chamber 16.

Figure 6B:
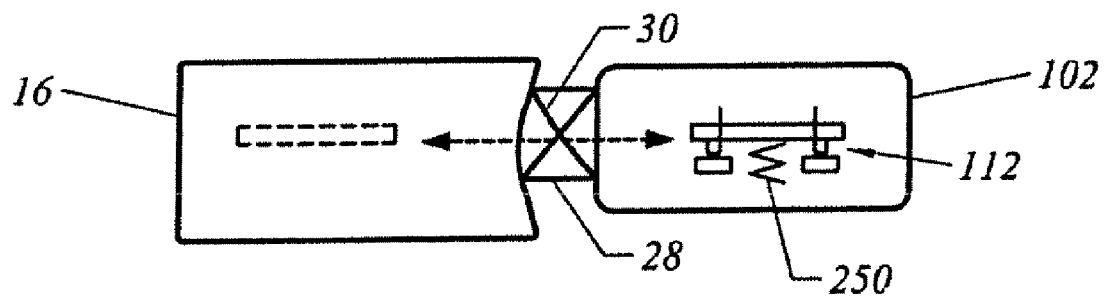

FIG. 6B illustrates a another embodiment of the wafer transfer system 100. In this embodiment, the chamber 16 and the wafer transfer system 100 are oriented such that a wafer 13 may be transferred between the chamber 16 and the wafer transport enclosure 102 in a substantially horizontal motion. The transition chamber 28 is located between the chamber 16 and the wafer transport enclosure 102. When the shuttle 112 comes to a complete stop proximate to the chamber 16, an isolation valve 30 opens. A horizontal lift mechanism 250, located within the wafer transport enclosure 102, engages the wafer 13, and places the wafer 13 into the chamber 16. The isolation valve 30 closes after the wafer 13 has been placed into the chamber 16 and the horizontal transfer mechanism 250 has retracted into the wafer transport enclosure 102. When the wafer processing is complete, the horizontal transfer mechanism 250 retrieves the wafer 13 from the chamber 16 and places the wafer 13 back onto the shuttle 112.

Figure 6C:
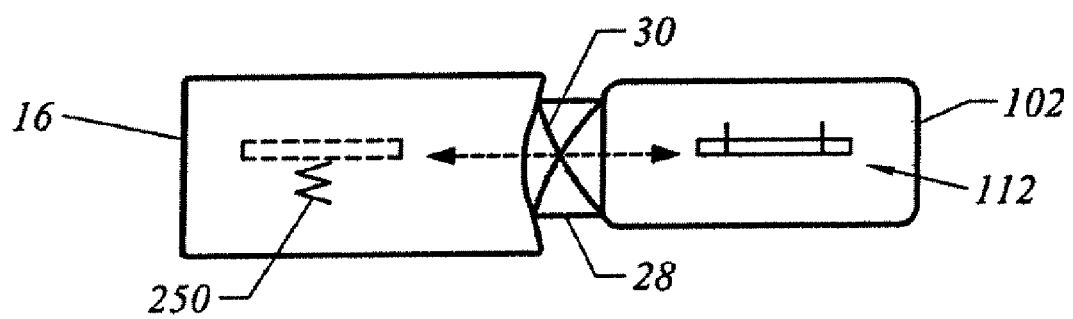

FIG. 6C illustrates yet another embodiment of the wafer transfer system 100. In this embodiment, a wafer transfer mechanism 250 is located within the chamber 16. When the shuttle 112 comes to a complete stop, an isolation valve 30 opens, allowing the wafer transfer mechanism 250 to retrieve the wafer 13 and place the wafer 12 within the chamber 16. The operation is similar to that described for the embodiment illustrated in FIG. 6B.

Figure 6D:
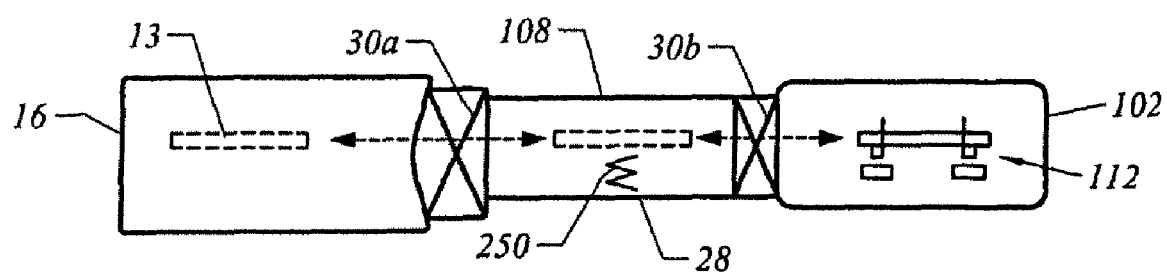

FIG. 6D illustrates another embodiment of the present invention whereby the wafer transfer mechanism 250 is located within the transition chamber 108. The wafer 13 is transferred between the chamber 16 and the wafer transport enclosure 102 by a similar method as described for the embodiments shown in FIGS. 6B-6C. However, the wafer transfer mechanism 250 is located within the transition chamber 28. The wafer transfer mechanism 250 can grip the wafer 13 by the edges along an exclusion area or can comprise a gravity hold mechanism.

In this embodiment, a first isolation valve 30a is located proximate to the chamber 16, and the second isolation valve 30b is located proximate to the wafer transport enclosure 102. In operation, a wafer shuttle 112 delivers a wafer 13 proximate to the second isolation valve 30b. The second isolation valve 30b then opens and the wafer transfer mechanism will transfer the wafer 13 from the wafer shuttle 112 into the transition chamber 108. The second isolation valve 30b then closes. Preferably, at this point, the transition chamber 108 is evacuated or filled with clean gas to ensure that the environment within the transition chamber 108 is clean and contains no contaminating particles. The first isolation valve 30a then opens and the wafer transfer mechanism transfers the wafer 13 into the chamber 16. After the wafer transfer mechanism 250 returns to its stand-by position, located completely within the transition chamber 108, the first isolation valve 30a closes. It is within the spirit and scope of the invention for other wafer components to secure to the transition chamber 108 such as, but not limited to, a stocker.

Figure 6E:
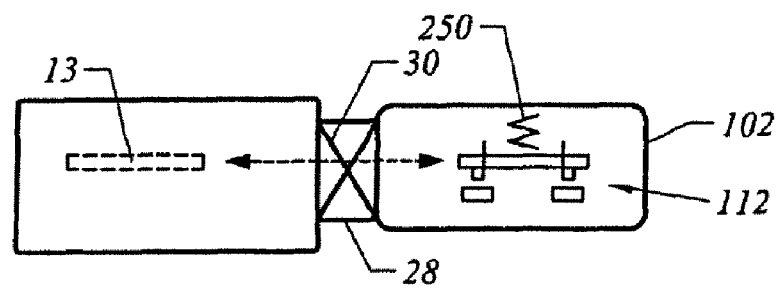

FIG. 6E illustrates a wafer transfer mechanism 250 that is a top-grabbing transfer mechanism. This embodiment grips the wafer 13 from the top. Technology for grabbing a wafer from the top is commonly known to one skilled in the art. By way of example only, U.S. Pat. No. 5,947,802, entitled "WAFER SHUTTLE SYSTEM," issued to Zhang et al., discloses a horizontal-oriented transfer mechanism for moving a semiconductor wafer from a first position to a second position.

In any of the embodiments disclosed herein, the shuttle 112 may be propelled through the wafer transport enclosure 102 by several different methods. A preferred embodiment of the linear transfer system 150 is a magnetic levitation system ("maglev"). A maglev system levitates the shuttle 112 by magnets that may be located either inside or outside the wafer transport enclosure 102.

Maglev systems offer a number of advantages over conventional transport systems that use steel wheels on steel rails. Because magnetic levitation objects do not touch a guideway, maglev systems overcome the principal limitation of wheeled vehicles—the high cost of maintaining precise alignment of the tracks to avoid excessive vibration and rail deterioration at high speeds. The fact that maglev vehicles do not touch a guideway also has other advantages: faster acceleration and braking; greater climbing capability; and reduced noise to name a few. Maglev systems are also energy efficient.

In one embodiment, the shuttle 112 includes a linear drive component 152 and two guide components 154.

Figure 9:
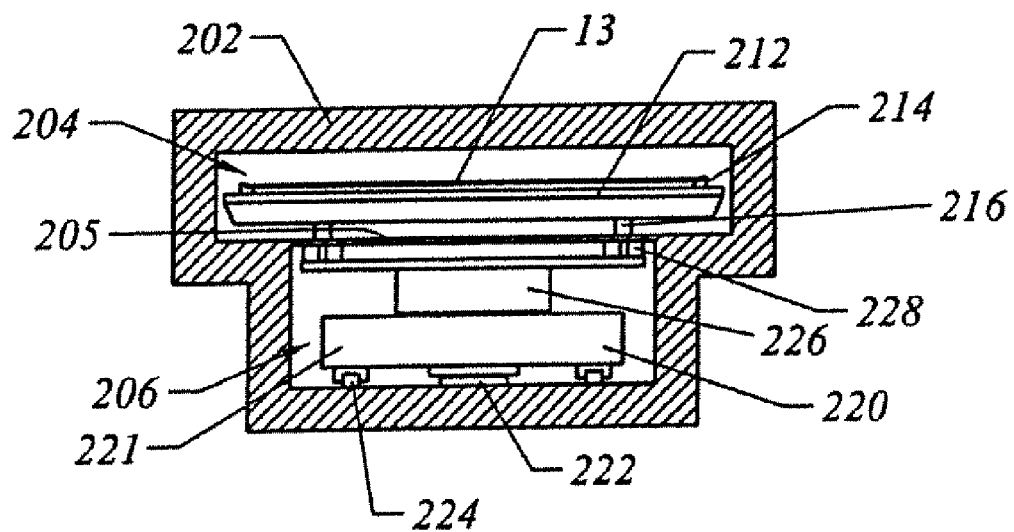
FIG. 9 is a front cross-sectional view of an embodiment of the wafer transport enclosure with a bifurcated vacuum area.

FIG. 9 illustrates another embodiment of a maglev system. in this embodiment, the wafer transport enclosure 202 is a bifurcated enclosure. The wafer transport enclosure 202 includes an upper chamber 204 and a lower chamber 206. The wafers 13 travel within the upper chamber 204. The lower chamber 206 is separated from the upper chamber 204 by a wall 205. For reasons described below, the wall 205 is preferably a thin barrier. By way of example only, the environment maintained within the upper chamber 204 may consist of vacuum, nitrogen, or other gad filled environments. If the upper chamber 204 is under vacuum, the lower chamber 206 is preferably under some level of vacuum to reduce the pressure on the wall 205.

One embodiment of the wafer shuttle 212 includes wafer supports 214 located on a cantilevered end effector support 230. Preferably, the wafer supports 214 support the wafer 13 along an exclusion area on the bottom surface of the wafer 13. The shuttle 212 also includes multiple permanent magnets 216 located on the bottom of the shuttle 212. Other configurations of the wafer shuttle 212 are within the spirit an scope of the invention.

A drive mechanism 220 travels within the lower chamber 206. In one embodiment, the drive mechanism 220 includes a body 221 that travels along linear bearing supports 224. A rotational drive 226 is mounted to the body 221. A magnet support platform 227 is secured to the rotational drive 226. The magnet support platform 227 supports magnets 228. Magnetic levitation of the shuttle 212 is accomplished because the magnets 228 repel the permanent magnets 216 on the shuttle 212. Thus, the wall 205 must be thin enough so that the permanent magnets 216 and the magnets 228 may form a magnetic coupling.

The shuttle 212 is levitated from below by the drive mechanism 220. Unlike many conventional maglev systems, this embodiment does not require an external moving cart. The drive mechanism 220 is instead lifted and propelled by stationary coil elements 222 with varying electrical control inputs. Except for the rotation drive 226, there is no particle generation and no moving parts affiliated with the maglev system.

In the bifurcated wafer transport enclosure 202 configuration, the maglev system provides passively stable supports for the shuttle 212, i.e. no control feed back is required for levitation. The permanent magnets 216 located on the shuttle 212 and the permanent magnets 228 located on the drive mechanism 220 magnetically repel each other. Accordingly, the shuttle 212 is lifted by the repulsion force of like poles but rests in local minimum flux density troughs or pockets. This makes the maglev system "fail-safe" and makes precise control of the shuttle 212 easier. If power to the wafer transport system 200 is lost, the shuttle will slow to a stop and remain levitated above the wall 205. The magnetic repulsion by the magnets will not allow the shuttle 212 to contact the wall 205. Control feedback and active electro magnets may be used in conjunction with permanent magnets to improve the rigidity of the shuttle levitation and to improve the control the shuttle location.

Figure 10:
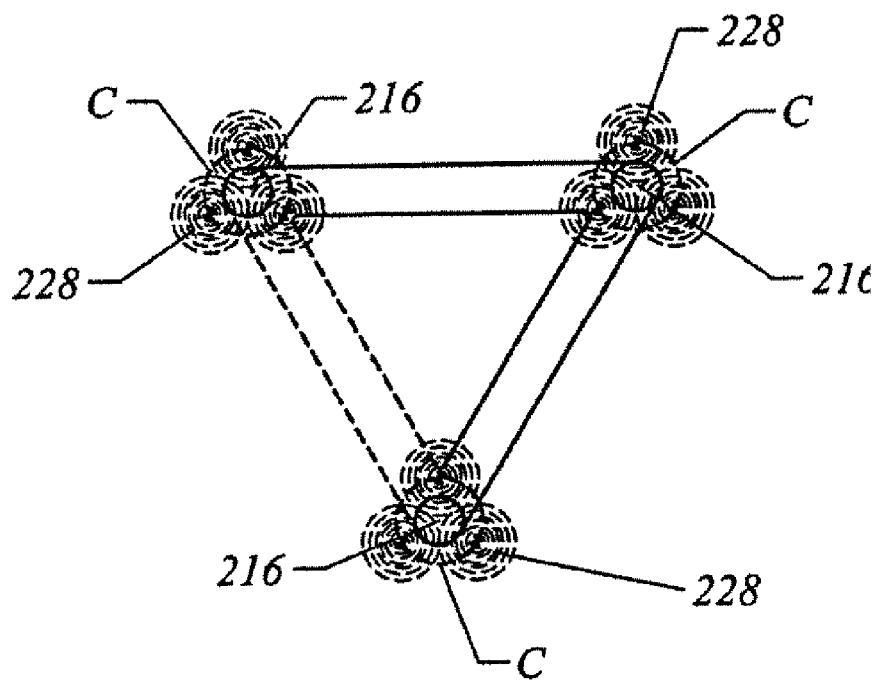
FIG. 10 is a schematic view of an embodiment of a permanent magnet arrangement according to the present invention.

The rotational drive 226 may rotate in either a clockwise or counterclockwise direction. FIG. 10 is a plan view of an embodiment of the magnetic coupling between the permanent magnets 216 of the shuttle 202 and the permanent magnets 228 of the drive mechanism 220. the permanent magnets 216 of the shuttle 202 and the permanent magnets 228 of the drive mechanism 220 always remain separated by the wall 205. The center of each permanent magnet 216 of the shuttle 202 is preferably located within a circle C. The circle C is defined by an imaginary continuous line that passes through substantially the center of the three permanent magnets 228. Accordingly, when the rotational drive 226 rotates in a clockwise direction (from the perspective of FIG. 10), the magnetic coupling between magnets 216 and 228 will rotate the shuttle 212 in a clockwise direction.

Figure 8A:
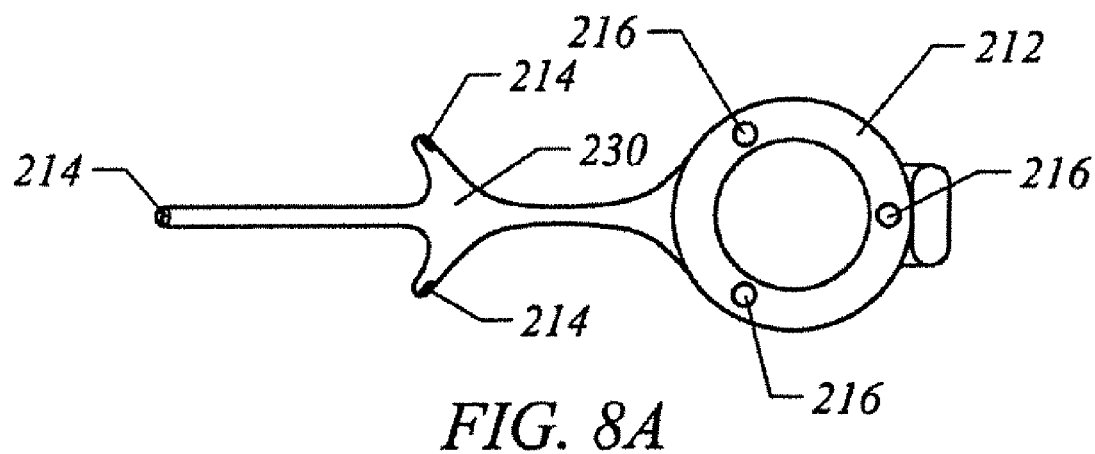
FIGS. 8A-8B.
Figure 8B:
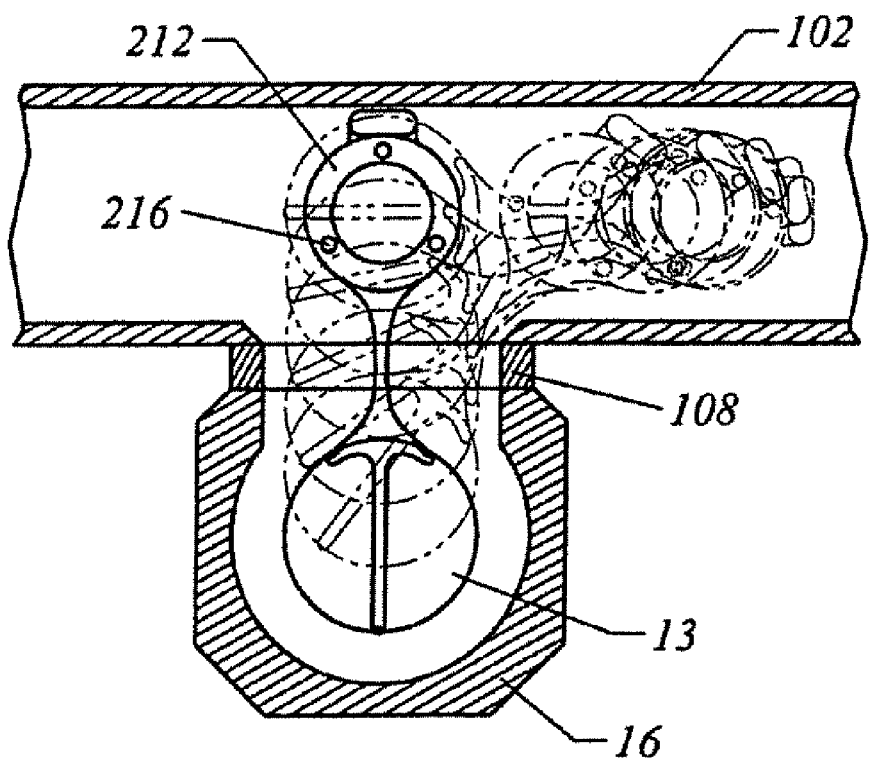

The cantilevered end effector support 230 allows the shuttle 212 to insert a wafer 13 into a chamber 16, and remove a wafer 13 from a chamber. The linear motion and rotation of the shuttle 212 must be coordinated so that neither the shuttle 212 nor the wafer 13 come into contact with the wafer transport enclosure 202. FIG. 8B illustrates the motion of a shuttle 212 with a cantilevered end effector support 230.

Figure 7:
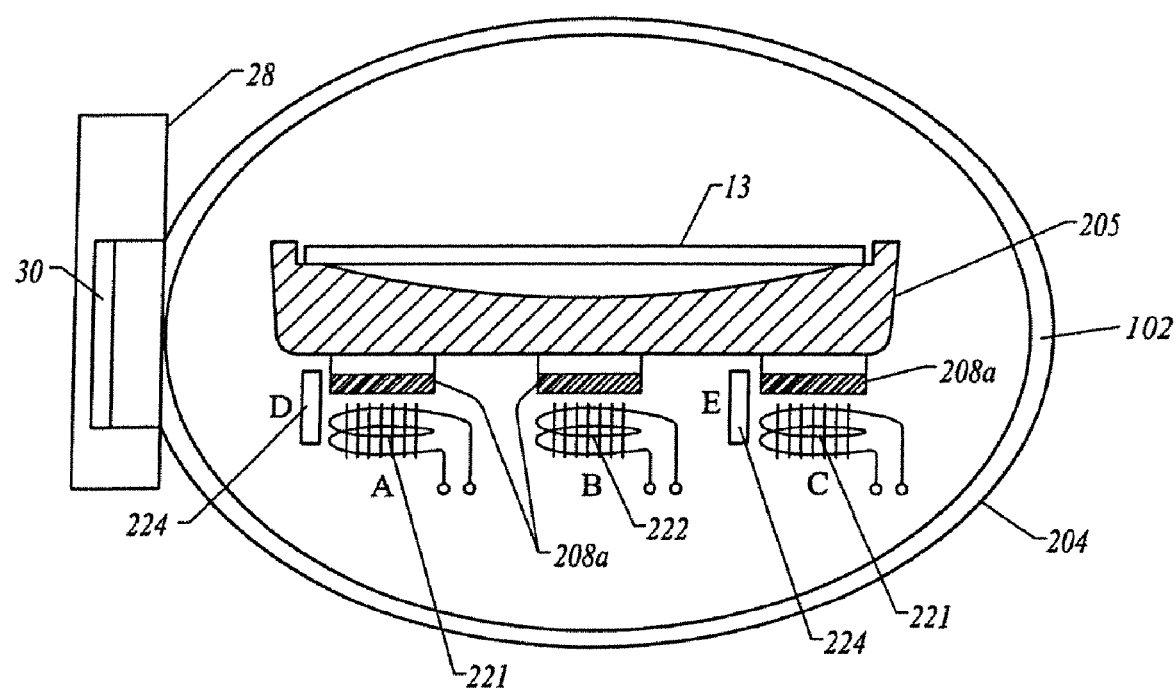
FIG. 7 is a front view of an embodiment of the present invention, illustrating an embodiment of a magnetic levitation system for propelling the wafer shuttle along the wafer transport enclosure.

FIGS. 5-7 illustrate another embodiment of the maglev system and shuttle. In this embodiment, the shuttle system utilizes linear drive motors, and position and velocity sensing devices located within the wafer transport enclosure 102. The shuttles 112 are flexibly docked at modules, wafer lock engines, tool transports and stocking sections. As shown in FIG. 7, linear induction motor 222 and positions sensors 224 maintain stable separation distance between the linear drive components 206a, 206b and the magnetic guiding components 208a, 208b. As the shuttle 112 speeds along the track within the wafer transport enclosure 102, alternating the electric currents passed through each levitation coil 220, constantly changing the coils magnetic polarity. Current causes each levitation coil 220 to change its polarity (N to S:S to N) as each magnet passes. When the shuttle magnets line up N-S or S-N, the result is a traction or "pull" forward. When the magnet line up N-N or S-S, the result is repulsion or "push" forward. To make the shuttle 112 speed up or slow down, the electric power fed into the linear induction motor 222 is increased or decreased. This changes the speed at which the magnetic wave travels underneath the shuttle 112. The system causes the shuttle 112 to move upon a cushion of air. Therefore, the shuttle 112 is not limited by friction with the track. The shuttle 112 is also preferably constructed from light weight materials.

The linear transport system 200 is composed of multiple alternating current electromagnetic rows composed of alternating current electromagnets. The magnets repel the shuttle linear drive and guide components 206a, 208a. This row of alternating electromagnetic magnets functions as a linear motor. On both sides of the linear motor are height sensors for detecting the wafer levitation height from the motor top surface, and further has position sensors for detecting the conveying speed of the shuttle. The changing magnetic flux forces eddy currents to flow, applying force to the shuttle 112. In an isolated environment, the magnetic levitation system does not create any particulates, minimizing contamination of the traveling wafer.

Figure 11A:
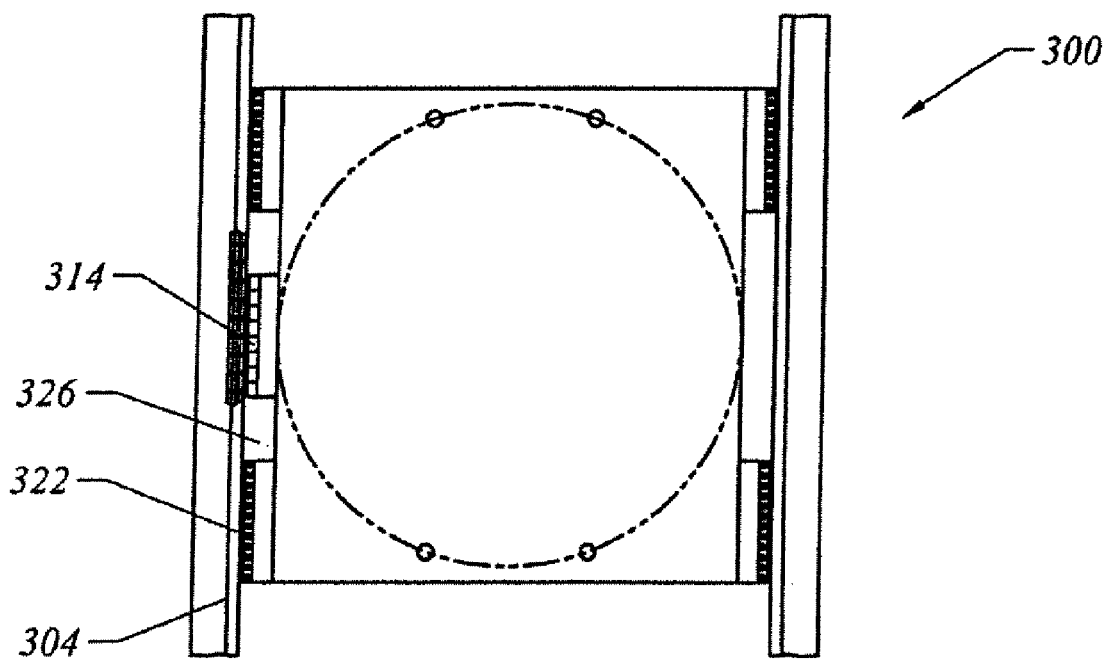
FIGS. 11A-11C.
Figure 11B:
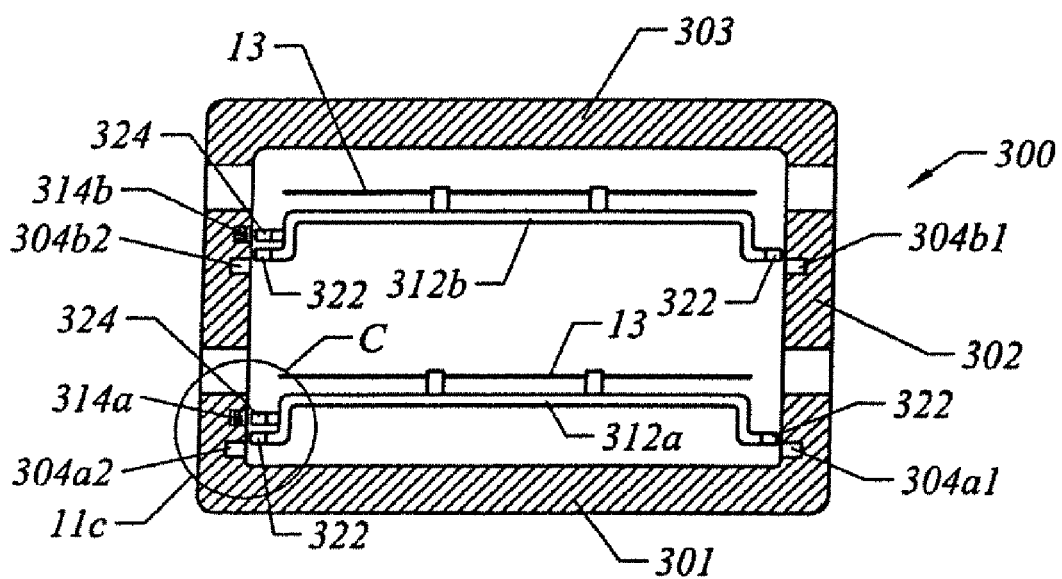
Figure 11C:
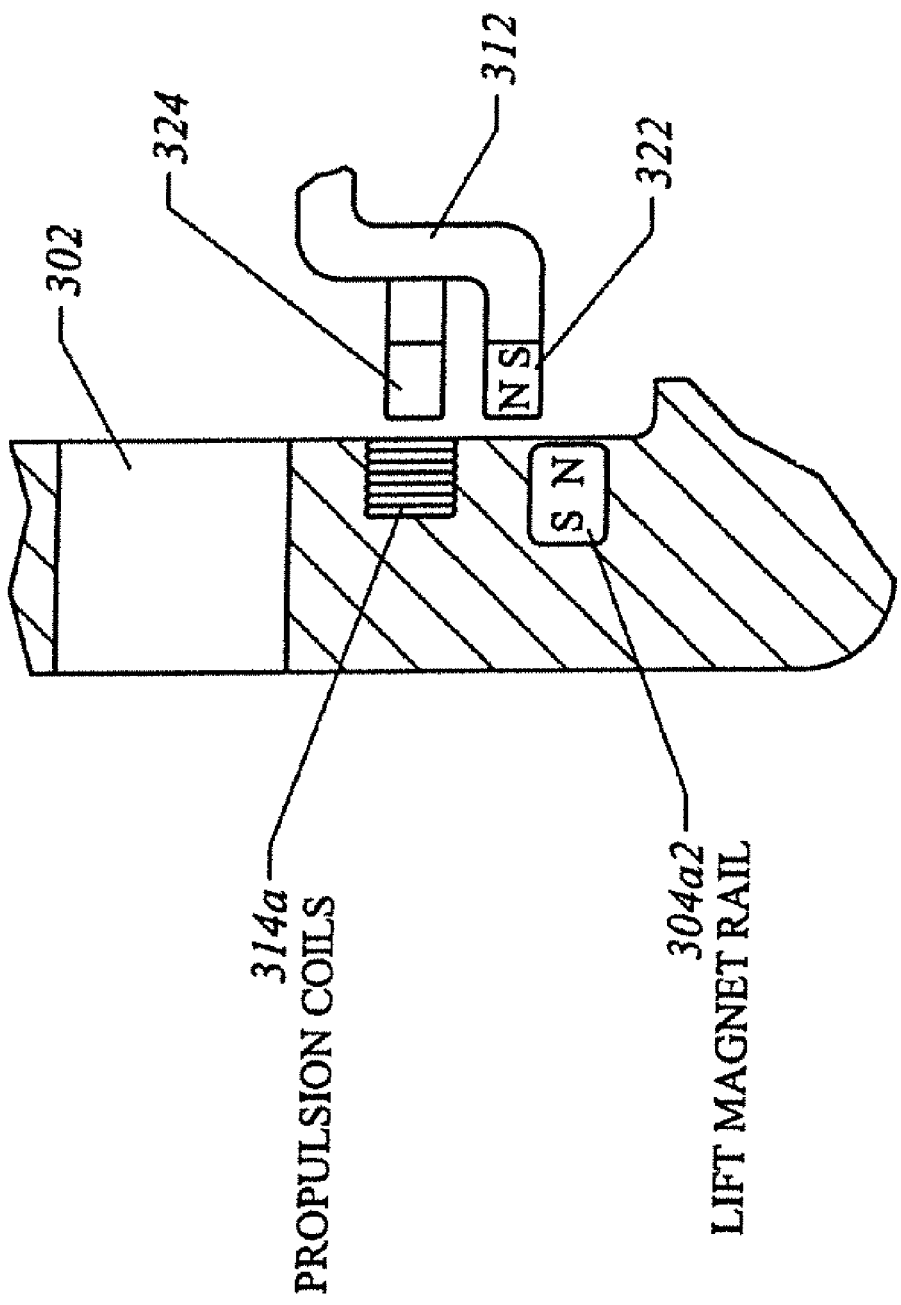

FIGS. 11A-11C illustrate a dual level slide supported maglev shuttle transport system 300. One advantage of a vertically layered transport tunnel is to provide bi-directional motion for the shuttles 312. Vertically stacked shuttle rails 304 offers floor space savings and versatile wafer routing capabilities. Vertically stacking the rails also provides the ability to move shuttles 312 between layers to avoid a pile up at the end of a wafer transport enclosure 302, and allows dynamic routing of wafers. Wafers can randomly be sent to metrology or inspection stations, which accommodates changes in the processing sequence due to different designs (small lots). Having multiple rails that a shuttle 302 may travel upon also allows bypassing by "hot lot" wafers.

Similar to the embodiment shown in FIG. 9, this alternative embodiment shown in FIGS. 11A-11C includes passively stable side magnet rails 304 that will hold the shuttle 312 at a predetermined vertical level within the wafer transport enclosure 312 in the event the system losses power. Propulsion coils 314 are shorted in a stop condition for passive dynamic braking of the shuttles 312 for fail safe shut down even when the shuttles 312 are moving fast. Extremely fast wafer transport is possible in vacuum with no particle generation or disturbance.

FIG. 11B illustrates a wafer transport enclosure 302 that includes a first magnet rail 304a and a second magnet rail 304b. The rails are vertically "stacked" and are spaced apart so that a wafer 13 carried by the shuttle 312a will not interfere will the shuttle 312b as it passes by. A wafer transport enclosure 302 may have any number of magnet rails 304. Each magnet rail 304 must simply be separated from an adjacent magnet rail 304 such that the shuttles 312 will not obstruct the path of a passing shuttle 312. In essence, vertically stacked rails within a single wafer transport enclosure 302 creates a highway system that shuttles 312 may travel along throughout the wafer fabrication facility. The shuttle 312 may have any configuration that will support a wafer in a substantially horizontal or vertical orientation, including the shuttle 212 previously is disclosed.

The embedded magnet rails 304 allow, by way of example only, a simple bellows lift mechanism (not shown) to vertically lift or lower a shuttle 312 between rails 304a and 304b. This system creates rail jumping for dynamic wafer routing. Open loop support and propulsion is possible, eliminating the need for complex and expensive position feedback mechanisms. Precise movement while the shuttle 312 is traveling between chambers 16 is not required.

However, precision location of a shuttle 312 is necessary at stations within the wafer transport enclosure 302 whereby the wafer will be transported. For example, when a wafer shuttle 312 stops proximate to a chamber 16, the position of the wafer 13 and a robot arm within the chamber 16 must be coordinated so that the robot arm may engage the wafer and transfer the wafer into the chamber 16. There are several ways to accomplish this. By way of example only, pin registration can locate a shuttle 312 precisely at stations if needed, or local closed loop control could be used at stations.

In a preferred embodiment of the wafer transfer system 300, the top surface 303 and the bottom surface 301 of the wafer transport enclosure 302 are not used by the transport shuttles 312. Instead, the top and bottom surfaces 303 and 301 may be occupied by hand-off arms or shuttle vertical lift mechanisms.

Figures 12A, 12B:
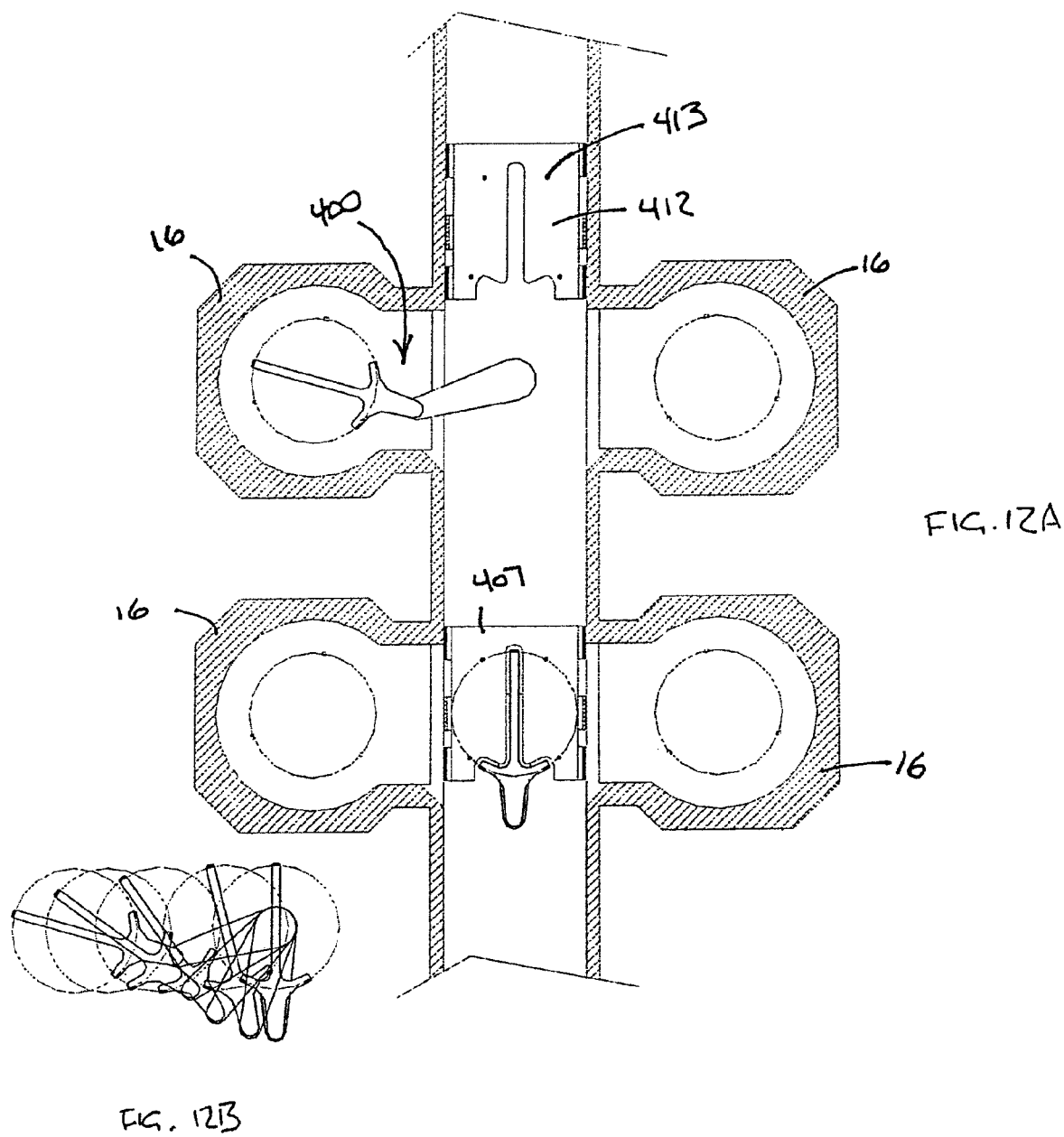
FIGS. 12A-12B.

FIGS. 12A-12B illustrate an example of a two axis hand-off arm 400 that could rest below the shuttle 312 when the shuttle 312 comes to a stop. In operation, the two axis hand-off arm 400 may move vertically up to lift a wafer 13 off a shuttle 312 and rotate to place the wafer 13 in a chamber 16. FIG. 12A illustrates a further embodiment of a wafer shuttle. The wafer shuttle 412 is shaped so that the hand off arm 400 may pass up through the body 407 of the shuttle 412, engage the wafer, and remove the wafer from the shuttle 412. The hand-off arm 400 may also place a wafer 13 onto the shuttle 412. In operation, the hand-off arm 400 lowers the wafer 13 back onto the wafer supports 413 and continues to travel through the body 407 of the shuttle 412 until the hand-off arm 400 reaches a stand-by position. The stand-by position is located under the shuttle 412, such that a shuttle 412 may pass over the hand-off arm 400 when the hand-off arm 400 is in the stand-by position.

FIG. 11B illustrates that the side magnet rails 304 are preferably integrated into the interior wall of the wafer transport enclosure 302. It is within the spirit and scope of the invention to mount the side magnet rails 304 to the interior of the wafer transport enclosure 302.

In a preferred embodiment, the shuttle 312 includes lift magnets 322 and propulsion magnets 324. The lift magnets 322 form a magnetic coupling with the magnets rail 304, such that the shuttle 312 is levitated. The propulsion magnets 324 are located proximate to the propulsion coils 314 located within the wafer transport enclosure 302. The wafer shuttle 312 is propelled through the wafer transport enclosure 302 by the magnetic forces created by the propulsion coils 314. By way of example only, a 3-phase linear motor may create the magnetic forces in the propulsion coils 314.

The wafer transfer system 300 may include wafer index stations (not shown) that are dedicated to vertically transferring shuttles 312 between different magnetic rails 304. Open loop or closed loop lift mechanisms (not shown) may move the shuttles 312 vertically between magnetic rails 304.

Preferably, any of the wafer transfer systems previously described may include an inspection station that reads the alpha-numeric number or bar code on a wafer 13 as it travels through the wafer transfer system. Most conventional tracking systems require the wafer to have an alpha-numeric code or bar code located on the edge of the wafer. To read either the alpha-numeric code or bar code, the wafer must be rotated to find the notch, which has a known relation to the alpha-numeric or bar code. This process requires stopping the wafer within the wafer transport system. An example of a method for reading identification marks on a wafer is disclosed in U.S. Pat. No. 5,831,738, entitled "APPARATUS AND METHOD FOR VIEWING IDENTIFICATION MARKS ON SEMICONDUCTOR WAFERS," issued to Hine, and incorporated herein by reference.

It is desirable to not stop the wafer 12 within the wafer transport enclosure 102 simply to read an identification mark. In a preferred embodiment, an inspection station will include a sensing device to ascertain the wafer identification at specific routing and storage points within the wafer transfer system 100. By way of example only, an identification mark may be placed on the centerline of the backside of the wafer. The wafers may utilize an advanced marking approach that enables identification without the need for the prealignment, which is necessary with today's perimeter based alpha-numeric codes. Alternatively, a snowflake mark may be placed on the back, in the center, of the wafer. Such a mark may be read at any angle and has a high read integrity without having to stop the wafer shuttle 112.

The foregoing description of preferred embodiments of the present invention has been provided for the purposes of illustration and description. It is not intended to be exhaustive or to limit the invention to the precise forms disclosed. Obviously, many modifications and variations will be apparent to the practitioner skilled in the art. The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalence.

The invention claimed is:

1. A wafer transport system for moving semiconductor wafers to and from wafer processing chambers, comprising:
    a wafer carrier configured to travel along a path;
    a first wafer transfer chamber interfaced with a first wafer processing chamber, the first wafer transfer chamber disposed in the path of the wafer carrier, the first wafer transfer chamber having a first wafer transfer mechanism defined to transfer the semiconductor wafer to and from the first wafer processing chamber that is not disposed in the path but is adjacent to the path;
    a second wafer transfer chamber interfaced with a second wafer processing chamber, the second wafer transfer chamber disposed in the path of the wafer carrier, the second wafer transfer chamber having a second wafer transfer mechanism defined to enable a transfer of the semiconductor wafer to and from the second wafer processing chamber that is not disposed in the path but is adjacent to the path; and
    a wafer transfer enclosure disposed in the path to connect the first wafer transfer chamber with the second wafer transfer chamber, wherein each of the first wafer transfer chamber, the second wafer transfer chamber and the wafer transfer enclosure have path segments that couple together to define the path on which the wafer carrier moves in and along the wafer transfer enclosure, the first wafer transfer chamber and the second wafer transfer chamber;
    wherein each of the first and second wafer transfer chambers and the wafer transfer enclosure is configured to support two wafer carriers in a vertically stacked orientation, so as to facilitate independent movement of each of the two wafer carriers through each of the first and second wafer transfer chambers and the wafer transfer enclosure in an in-line fashion.

2. The wafer transport system as recited in claim 1, wherein the first wafer transfer chamber and the first wafer processing chamber are defined to be connected through a first transition chamber, the first transition chamber being defined to provide an environmental isolation between the first wafer transfer chamber and the first wafer processing chamber.

3. The wafer transport system as recited in claim 1, wherein one or both of the first and second wafer transfer chambers having a plurality of openings each defined to receive one of a plurality of wafer processing chambers.

4. The wafer transport system as recited in claim 1, wherein one or both of the first and second wafer transfer mechanisms includes a robot mechanism to grab the semiconductor wafer from the wafer carrier in the path and transfer the semiconductor wafer from the path to the first or second wafer processing chamber, respectively.

5. The wafer transport system as recited in claim 1, wherein one or both of the first and second wafer transfer mechanisms is defined on a top side wall of the first or second wafer transfer chamber, respectively.

6. The wafer transport system as recited in claim 1, wherein one or both of the first and second wafer transfer mechanisms is defined on a bottom side wall of the first or second wafer transfer chamber, respectively.

7. The wafer transport system as recited in claim 1, wherein the path is magnetic and at least one of the two wafer carriers is defined to float on the path.

8. The wafer transport system as recited in claim 1, further including a propulsion coil defined to control the movement of at least one of the two wafer carriers.

9. A wafer transport system for moving semiconductor wafers to and from wafer processing chambers, comprising:
   a first wafer transport tube, the first wafer transport tube defining a path along which a wafer carrier is configured to travel;
   a first wafer transfer chamber coupled to the first wafer transport tube in an in-line configuration, the first wafer transfer chamber facilitating movement of the wafer carrier in-line with the path defined by the first wafer transport tube;
   a first wafer processing chamber coupled to the first wafer transfer chamber;
   wherein the first wafer transfer chamber includes a first wafer transfer mechanism for transferring a semiconductor wafer to and from the first wafer processing chamber;
   wherein each of the first wafer transport tube and the first wafer transfer chamber is configured to support two wafer carriers in a vertically stacked orientation, so as to facilitate independent movement of each of the two wafer carriers through both the first wafer transport tube and the first wafer transfer chamber in an in-line fashion.

10. The wafer transport system of claim 9, further including
    a second wafer transfer chamber coupled to the first wafer transport tube in an in-line configuration at an end of the first wafer transport tube opposite that of the first wafer transfer chamber, the second wafer transfer chamber facilitating movement of the wafer carrier in-line with the path defined by the first wafer transport tube; and
    a second wafer processing chamber coupled to the second wafer transfer chamber;
    wherein the second wafer transfer chamber includes a second wafer transfer mechanism for transferring a semiconductor wafer to and from the second wafer processing chamber.

11. The wafer transport system of claim 9, further including a second wafer transport tube coupled to the first wafer transfer chamber in an in-line configuration at an end of the first wafer transfer chamber opposite the first wafer transport tube, the second wafer transport tube facilitating movement of the wafer carrier in-line with the path defined by the first wafer transport tube.

12. The wafer transport system of claim 9, wherein the first wafer transfer chamber and the first wafer processing chamber are defined to be connected through a transition chamber, the transition chamber being defined to provide an environmental isolation between the first wafer transfer chamber and the first wafer processing chamber.

13. The wafer transport system as recited in claim 9, wherein the first wafer transfer chamber having a plurality of openings each defined to receive one of a plurality of wafer processing chambers.

14. The wafer transport system as recited in claim 9, wherein the first wafer transfer mechanism includes a robot mechanism to grab the semiconductor wafer from the wafer carrier and transfer the semiconductor wafer to the first wafer processing chamber.

15. The wafer transport system as recited in claim 9, wherein the first wafer transfer mechanism is defined on a top side wall of the first wafer transfer chamber.

16. The wafer transport system as recited in claim 9, wherein the wafer transfer mechanism is defined on a bottom side wall of the first wafer transfer chamber.

17. The wafer transport system as recited in claim 9, wherein each of the first wafer transport tube and the first wafer transfer chamber includes a magnetic levitation system configured to propel the wafer carrier through both the first wafer transport tube and the first wafer transfer chamber in an in-line fashion.

* * * * *